(12) United States Patent
Horikawa et al.

(10) Patent No.: US 12,336,347 B2
(45) Date of Patent: Jun. 17, 2025

(54) LIGHT EMITTING DEVICE

(71) Applicant: NICHIA CORPORATION, Anan (JP)

(72) Inventors: Yuta Horikawa, Anan (JP); Akihiro Fujioka, Tokushima (JP); Kazuya Matsuda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 519 days.

(21) Appl. No.: 17/804,290

(22) Filed: May 26, 2022

(65) Prior Publication Data
US 2022/0384694 A1 Dec. 1, 2022

(30) Foreign Application Priority Data
May 26, 2021 (JP) .................................. 2021-088328

(51) Int. Cl.
| | |
|---|---|
| *H01L 25/075* | (2006.01) |
| *H10H 20/851* | (2025.01) |
| *H10H 20/854* | (2025.01) |
| *H10H 20/857* | (2025.01) |
| H10H 20/825 | (2025.01) |
| H10H 20/858 | (2025.01) |

(52) U.S. Cl.
CPC ....... *H10H 20/854* (2025.01); *H01L 25/0753* (2013.01); *H10H 20/8512* (2025.01); *H10H 20/857* (2025.01); *H10H 20/825* (2025.01); *H10H 20/8583* (2025.01)

(58) Field of Classification Search
CPC .......... H01L 33/00–648; H01L 33/486; H01L 33/54; H01L 33/56; H01L 33/60; H01L 33/62; H01L 2933/0066
See application file for complete search history.

(56) References Cited

U.S. PATENT DOCUMENTS

| | | | |
|---|---|---|---|
| 2007/0228390 A1* | 10/2007 | Hattori | H01L 33/505 257/E33.059 |
| 2012/0313131 A1 | 12/2012 | Oda et al. | |
| 2013/0015488 A1* | 1/2013 | Yoon | H01L 33/486 257/E33.059 |

(Continued)

FOREIGN PATENT DOCUMENTS

| | | |
|---|---|---|
| CN | 110556367 A | 12/2019 |
| EP | 3471156 A1 | 4/2019 |

(Continued)

*Primary Examiner* — Eric A. Ward
(74) *Attorney, Agent, or Firm* — Hunton Andrews Kurth LLP (57) ABSTRACT

A light emitting device includes a resin package including a first lead, a second lead, a resin portion holding the first lead and the second lead, at least one light emitting element mounted on the resin package, and a covering member covering at least a portion of an upper surface of each of the first lead, the second lead, and the resin portion. The resin portion includes at least one resin recess between the first lead and the second lead. At least a portion of the resin recess is located between a first portion of the first lead and a second portion of the second lead in a first direction, and is located between a first extended portion of the first lead and a second extended portion of the second lead in a second direction, and at least a portion of the resin recess is covered by the covering member.

20 Claims, 4 Drawing Sheets

FIG.2A (56) References Cited

U.S. PATENT DOCUMENTS

| | | | |
|---|---|---|---|
| 2016/0190415 A1* | 6/2016 | Park | H01L 33/486 257/98 |
| 2017/0054061 A1 | 2/2017 | Naka et al. | |
| 2019/0019926 A1 | 1/2019 | Lee et al. | |
| 2019/0044039 A1 | 2/2019 | Lee et al. | |
| 2019/0088824 A1 | 3/2019 | Kim et al. | |
| 2019/0088837 A1 | 3/2019 | Lee et al. | |
| 2019/0333896 A1 | 10/2019 | Song et al. | |
| 2019/0334063 A1 | 10/2019 | Kim et al. | |
| 2019/0371981 A1* | 12/2019 | Bando | H01L 33/507 |
| 2020/0279982 A1* | 9/2020 | Lim | H10H 20/857 |
| 2020/0287107 A1* | 9/2020 | Lim | H01L 33/56 |
| 2021/0175392 A1* | 6/2021 | Kong | H01L 33/62 |

FOREIGN PATENT DOCUMENTS

| | | |
|---|---|---|
| JP | H10113946 A | 5/1998 |
| JP | 2000174065 A | 6/2000 |
| JP | 2001284378 A | 10/2001 |
| JP | 2013125776 A | 6/2013 |
| JP | 2013232590 A | 11/2013 |
| JP | 2016187053 A | 10/2016 |
| JP | 2019021919 A | 2/2019 |
| JP | 2019029673 A | 2/2019 |
| JP | 2020526004 A | 8/2020 |
| JP | 2020532851 A | 11/2020 |
| JP | 2020536370 A | 12/2020 |
| JP | 2020537329 A | 12/2020 |
| JP | 2021500735 A | 1/2021 |
| WO | 2019112345 A1 | 6/2019 |

* cited by examiner

LIGHT EMITTING DEVICE

CROSS-REFERENCE TO RELATED APPLICATIONS

This application is based upon and claims the benefit of priority from the prior Japanese Patent Application No. 2021-088328, filed on May 26, 2021, the entire contents of which are incorporated herein by reference.

TECHNICAL FIELD

The present disclosure relates to a light emitting device.

BACKGROUND ART

Light emitting devices including light emitting elements such as LEDs can easily achieve high light emission efficiency. Thus, such devices are used in many devices including backlights for display devices and lighting appliances. JP 2013-125776 A discloses a light emitting device that includes a resin package including positive and negative leads, a light emitting element mounted on the resin package, and a covering member that covers the positive and negative leads.

SUMMARY

One exemplary object of certain embodiments according to the present disclosure is to provide a light emitting device in which separation of a covering member from a resin package is reduced.

A light emitting device according to an exemplary embodiment includes a resin package including a first lead, a second lead, and a resin portion holding the first lead and the second lead, at least one light emitting element mounted on the resin package, and a covering member covering at least a portion of an upper surface of the first lead, at least a portion of an upper surface of the second lead, and at least a portion of an upper surface of the resin portion. The first lead includes a first portion and a first extended portion extending in a first direction from the first portion toward the second lead. The second lead includes a second portion overlapping the first portion in the first direction, and a second extended portion extending in the first direction from the second portion toward the first lead and overlapping with the first extended portion in a second direction orthogonal to the first direction. The resin portion includes, between the first lead and the second lead, at least one resin recess recessed lower than the upper surface of the first lead. At least a portion of the resin recess is located between the first portion and the second portion in the first direction, and is located between the first extended portion and the second extended portion in the second direction, and at least a portion of the resin recess is covered by the covering member.

According to a light emitting device according to certain embodiments of the present disclosure, it is possible to reduce separation of a covering member from a resin package.

DETAILED DESCRIPTION

Certain embodiments of the present disclosure will be described below with reference to the drawings. Since the embodiments are schematically illustrated in the drawings, scales and intervals of members, positional relationships between members, and the like may be exaggerated, some of the members may not be illustrated in the drawings, or an end surface view that only illustrates a cut section may be used as a cross-sectional view. Note that, in each of the drawings, the same constituent elements are given the same reference sings.

In the following description, constituent elements having substantially the same function may be denoted by the same reference signs, and descriptions thereof may be omitted. Further, terms indicating a specific direction or position ("upper", "lower", and other terms including those terms, for example) may be used. However, those terms are used merely to make it easier to understand relative directions or positions in the referenced drawing. As long as the relative direction or position is the same as that described in the referenced drawing using the term such as "upper" or "lower", in drawings other than the drawings of the present disclosure or actual products, components need not necessarily be arranged in the same manner as in the referenced drawing. In the present specification, a positional relationship expressed as "upper" includes a case in which components are in contact with each other, and also a case in which components are not in contact with each other but one component is located above the other component.

Embodiment

A light emitting device 100 according to the present embodiment will be described with reference to FIG. 1 to FIG. 5B. In order to illustrate the internal structure of the light emitting device 100, in FIG. 1, a first light-transmissive member 41 and a second light-transmissive member 42 are illustrated as transparent members. In FIGS. 5A and 5B, a boundary between a first portion 11A and a first extended portion 11B of a first lead 11, and a boundary between a second portion 12A and a second extended portion 12B of a second lead 12 are indicated by dashed lines. For reference, in FIGS. 1 to 5B, arrows respectively indicate an X direction, a Y direction, and a Z direction, which are orthogonal to each other.

Figure 1:
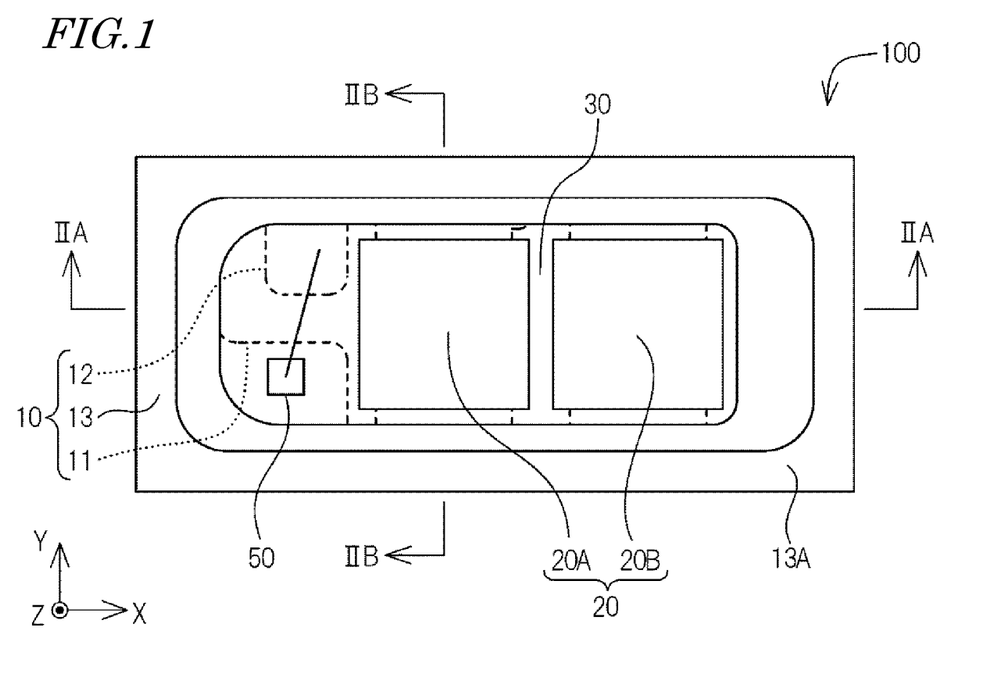
FIG. 1 is an exemplary schematic plan view of an exemplary light emitting device according to an embodiment of the present disclosure.

The light emitting device 100 includes a resin package 10, at least one light emitting element 20, and a covering member 30. The light emitting device 100 may further include the first light-transmissive member 41, the second light-transmissive member 42, and a protective element 50. The resin package 10 includes the first lead 11, the second lead 12, and a resin portion 13. The resin portion 13 holds the first lead 11 and the second lead 12. The at least one light emitting element 20 is mounted on the resin package 10. The covering member 30 covers at least a portion of the upper surface of the first lead 11, at least a portion of the upper surface of the second lead 12, and at least a portion of the upper surface of the resin portion 13. The first lead 11 includes the first portion 11A and the first extended portion 11B. The first extended portion 11B extends in a first direction from the first portion 11A toward the second lead 12 side. The second lead 12 includes the second portion 12A and the second extended portion 12B. The second portion 12A overlaps the first portion 11A in the first direction. The second extended portion 12B extends in the first direction from the second portion 12A toward the first lead 11 side, and overlaps the first extended portion 11B in a second direction orthogonal to the first direction. The resin portion 13 includes at least one resin recess 14 formed between the first lead 11 and the second lead 12, that is recessed lower than the upper surface of the first lead 11. At least a portion of the resin recess 14 is located between the first portion 11A and the second portion 12A in the first direction. At least a portion of the resin recess 14 is located between the first extended portion 11B and the second extended portion 12B in the second direction. At least a portion of the resin recess 14 is covered by the covering member 30. In FIG. 1, the first direction is the X direction, and the second direction is the Y direction. In the present specification, the first direction from the first portion 11A side toward the second portion 12A side may be referred to as a positive X direction, and the first direction from the second portion 12A side toward the first portion 11A side may be referred to as a negative X direction. The second direction from the first extended portion 11B side toward the second extended portion 12B side may be referred to as the positive Y direction, and the second direction from the second extended portion 12B side toward the first extended portion 11B side may be referred to as the negative Y direction. Further, the first lead 11 and/or the second lead 12 may be referred to as the "leads" or "the lead".

With the covering member 30 covering at least a portion of the resin recess 14, it can be facilitated to increase the contact area between the resin portion 13 and the covering member 30. Thus, adhesion between the resin portion 13 and the covering member 30 is improved, and thus it is possible to reduce separation of the covering member 30 from the resin package 10.

With at least the portion of the resin recess 14 located between the first portion 11A and the second portion 12A in the first direction, and between the first extended portion 11B and the second extended portion 12B in the second direction, cracking of the resin portion 13 can be reduced. Because the leads generally have a greater mechanical strength than the resin, even if a force is applied from the first direction and/or the second direction, the leads are less likely to deform than the resin. Accordingly, when at least the portion of the resin recess 14 is located between the leads, which are less likely to deform, deformation of the resin recess 14 can be reduced even when force is applied from the first direction and/or the second direction. Thus, cracking of the resin portion 13 can be reduced.

Each element constituting the light emitting device 100 will be described below in detail.

Resin Package 10

The resin package 10 is a member on which the light emitting element 20 is mounted. The resin package 10 includes the first lead 11, the second lead 12, and the resin portion 13.

The first lead 11 includes the first portion 11A and the first extended portion 11B. The first extended portion 11B extends from the first portion 11A toward the second lead 12 side in the first direction (X direction). The second lead 12 includes the second portion 12A and the second extended portion 12B. The second portion 12A overlaps the first portion 11A in the first direction (X direction). The second extended portion 12B extends in the first direction (X direction) from the second portion 12A toward the first lead 11 side, and overlaps the first extended portion 11B in the second direction (Y direction). In the first direction (X direction), the first portion 11A and the second portion 12A are disposed side by side. In the second direction (Y direction), the first extended portion 11B and the second extended portion 12B are disposed side by side. Note that the resin package 10 may have three or more of the leads instead of only the two leads, namely, the first lead 11 and the second lead 12.

The maximum length of the first extended portion 11B in the second direction (Y direction) is preferably shorter than the maximum length of the first portion 11A in the second direction (Y direction). This makes it easier to downsize the light emitting device 100 in the second direction (Y direction). In the second direction (Y direction), the first portion 11A preferably does not overlap the second lead 12. This makes it easier to downsize the light emitting device 100 in the second direction (Y direction). The maximum length of the second extended portion 12B in the second direction (Y direction) is preferably shorter than the maximum length of the second portion 12A in the second direction (Y direction). This makes it easier to downsize the light emitting device 100 in the second direction (Y direction). In the second direction (Y direction), the second portion 12A preferably does not overlap the first lead 11. This makes it easier to downsize the light emitting device 100 in the second direction (Y direction).

Figure 4:
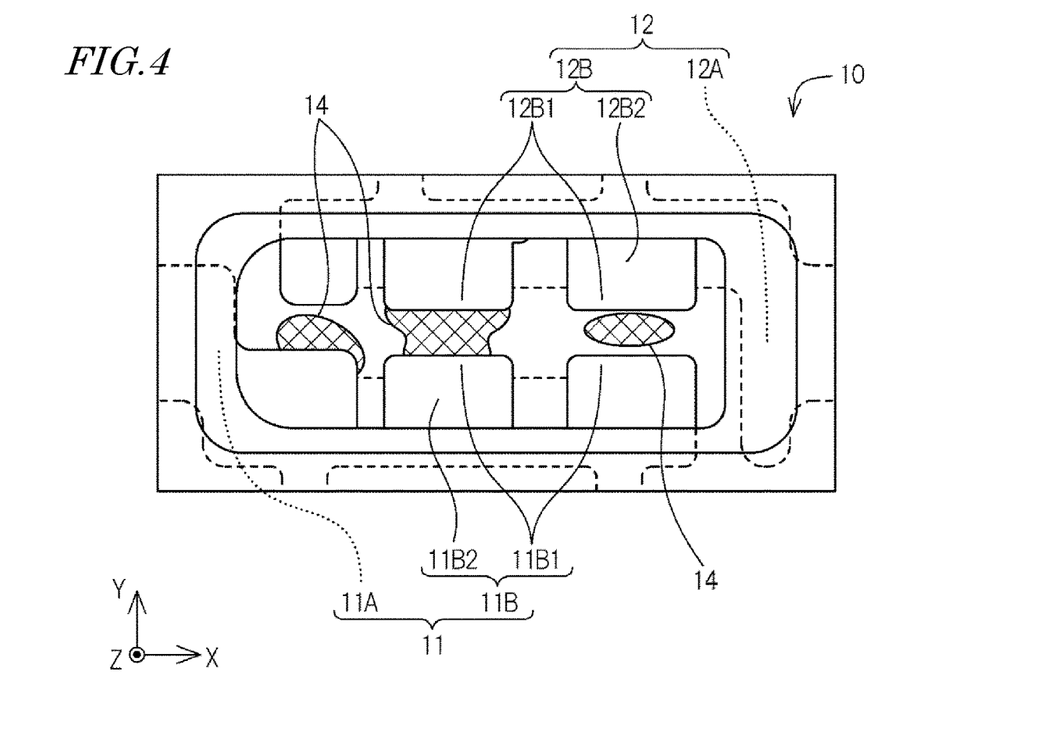
FIG. 4 is an exemplary schematic plan view illustrating an exemplary resin package according to the embodiment.
Figure 5A:
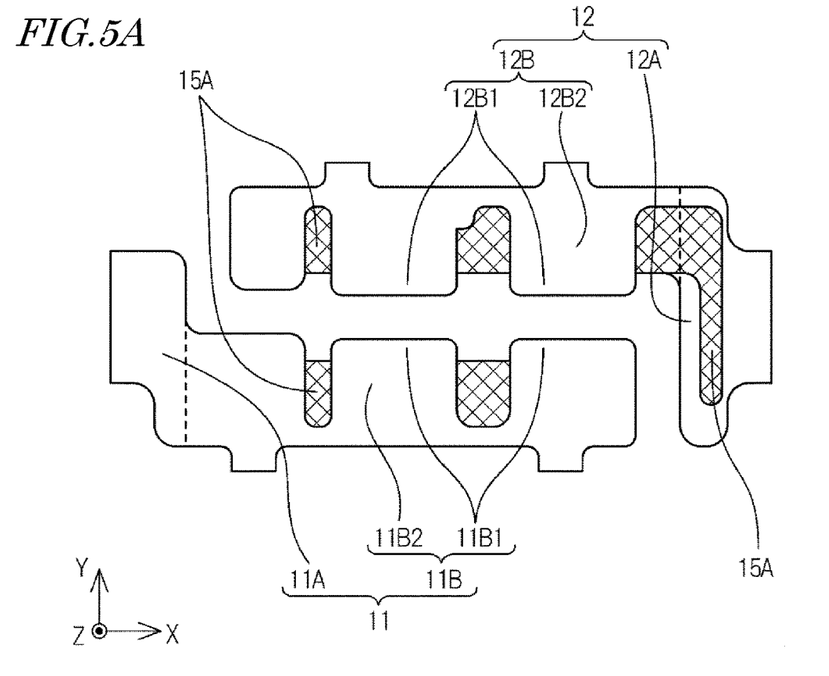
FIG. 5A is an exemplary schematic plan view illustrating a first lead and a second lead according to the embodiment.
Figure 5B:
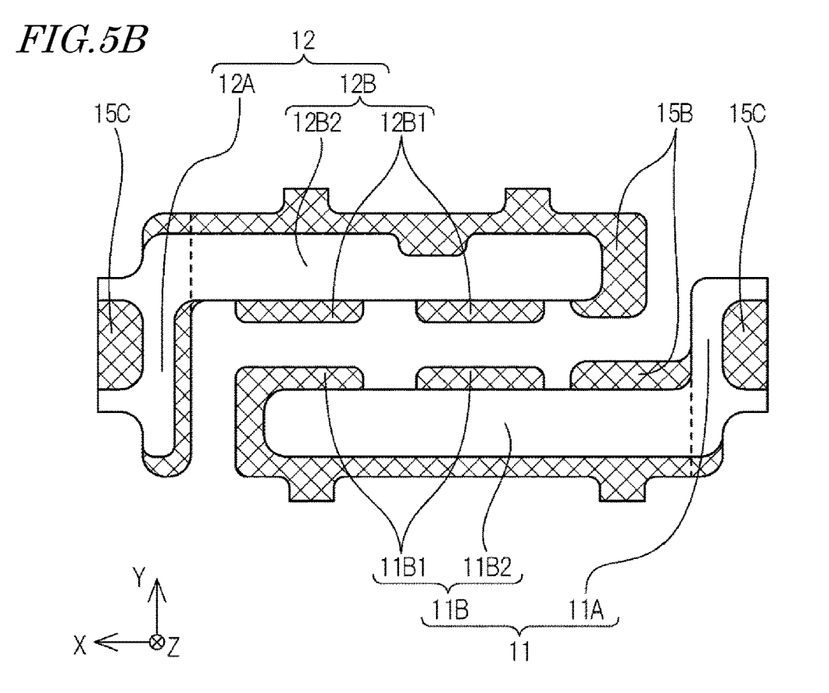
FIG. 5B is an exemplary schematic bottom view illustrating the first lead and the second lead according to the embodiment.

As illustrated in FIGS. 4, 5A, and 5B, the first extended portion 11B may include first protrusions 11B1 and a first extended portion main body 11B2. The first protrusions 11B1 extend in the second direction (Y direction) from the first extended portion main body 11B2 toward the second lead 12 side. One first protrusion 11B1 may extend from the first extended portion main body 11B2, or a plurality of the first protrusions 11B1 may extend from the first extended portion main body 11B2, as illustrated in FIGS. 4, 5A, and 5B. With the first extended portion 11B including the first protrusions 11B1, it can be further facilitated to increase the contact area between the first lead 11 and the resin portion 13. As a result, adhesion between the first lead 11 and the resin portion 13 is improved.

As illustrated in FIGS. 4, 5A, and 5B, the second extended portion 12B may include second protrusions 12B1 and a second extended portion main body 12B2. The second protrusions 12B1 face the first protrusions 11B1 in the second direction (Y direction). The second protrusions 12B1 extend in the second direction (Y direction) from the second extended portion main body 12B2 toward the first lead 11 side. One second protrusion 12B1 may extend from the second extended portion main body 12B2, or a plurality of the second protrusions 12B1 may extend from the second extended portion main body 12B2, as illustrated in FIGS. 4, 5A, and 5B. With the second extended portion 12B including the second protrusion 12B1, it can be facilitated to increase the contact area between the second lead 12 and the resin portion 13.

As illustrated in FIG. 5A, first grooves 15A (indicated by hatching) are preferably formed in the upper surface of the first lead 11 and/or the second lead 12. The first groove 15A is recessed lower than the upper surface of the first lead 11 and/or the second lead 12. The first groove 15A can be formed by etching, pressing, or the like. The resin portion 13 is disposed inside the first groove 15A. As a result, adhesion between the resin portion 13 and the first lead 11 and/or the second lead 12 is improved.

As illustrated in FIG. 5B, second grooves 15B (indicated by hatching) are preferably formed in the lower surface of the first lead 11 and/or the second lead 12. The second groove 15B is recessed upward from the lower surface of the first lead 11 and/or the second lead 12. The second groove 15B can be formed by etching, pressing, or the like. The second groove 15B is disposed along the outer edge of the first lead 11 and/or the second lead 12. The resin portion 13 is disposed inside the second groove 15B. As a result, adhesion between the resin portion 13 and the first lead 11 and/or the second lead 12 is improved. The second grooves 15B are preferably formed in the lower surface of each first protrusion 11B1 and each second protrusion 12B1. With this structure, when the resin portion 13 is formed by injection molding or the like, non-filling of the resin portion 13 can be prevented.

Figure 2A:
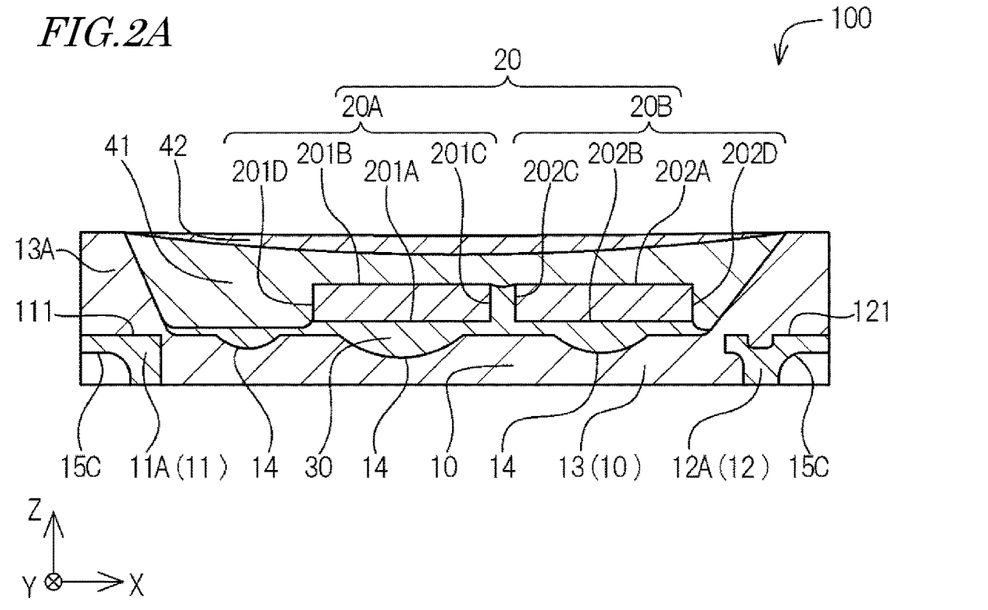
FIG. 2A is an exemplary schematic cross-sectional view taken along line IIA-IIA illustrated in FIG. 1.

As illustrated in FIG. 2A, the first lead 11 and/or the second lead 12 may include a third groove 15C that opens to the lower surface and the lateral surface of the resin package 10. The third groove 15C functions as a castellation. For example, when the light emitting device 100 is solder-bonded to a mounting substrate, because the light emitting device 100 includes the third groove 15C, it is easier to check the melting state of the solder.

Figure 3:
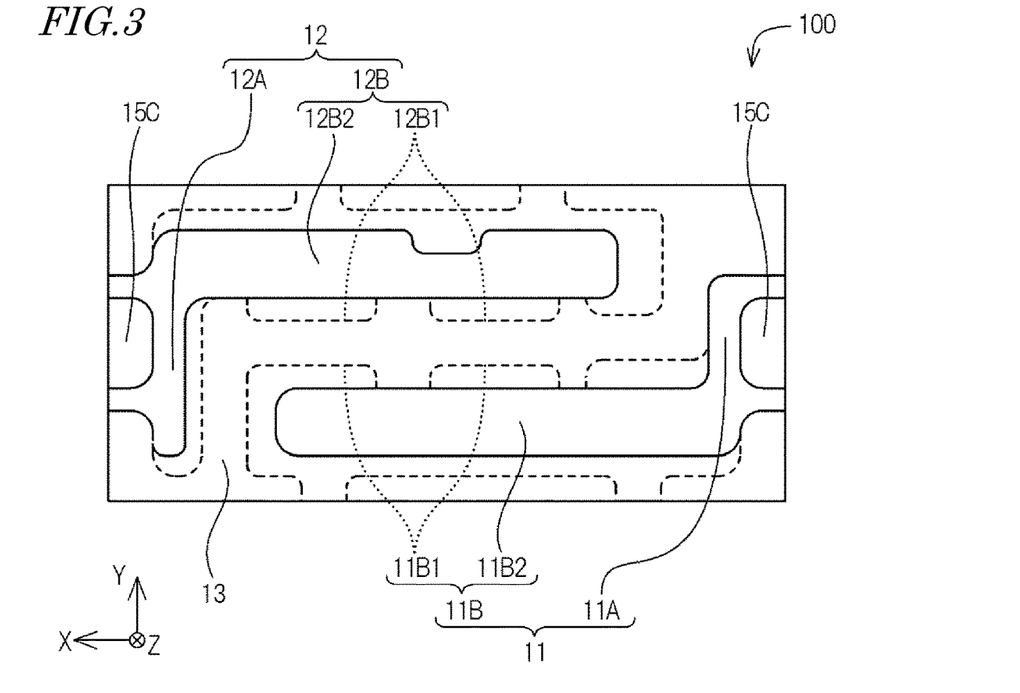
FIG. 3 is an exemplary schematic bottom view of the exemplary light emitting device according to the embodiment.

As illustrated in FIG. 3, the first lead 11 and the second lead 12 are preferably exposed from the resin portion 13 on the lower surface of the light emitting device 100. In this way, heat generated from the light emitting device 100 is easily transferred from the first lead 11 and the second lead 12 to the mounting substrate on which the light emitting device 100 is mounted. As a result, heat dissipation performance of the light emitting device 100 can be improved.

The first lead 11 and the second lead 12 are members that are electrically connected to the light emitting element 20 to supply electricity to the light emitting element 20. The first lead 11 and the second lead 12 can be formed into a predetermined shape by, for example, rolling, punching, extruding, wet-etching, dry-etching, or performing a combination of these using a metal such as copper, aluminum, gold, silver, iron, nickel, an alloy of these metals, phosphor bronze, or copper containing iron. The first lead 11 and the second lead 12 may have a single-layer structure or a layered structure. It is particularly preferable to use copper, which is inexpensive and has high heat dissipating properties. In order to improve reflectivity, a metal plating of silver, aluminum, copper, or gold may be applied to a portion or the entire surface of the first lead 11 and the second lead 12 each having the single-layer or the layered structure. Note that when a metal layer containing silver is formed on the outermost surfaces of the first lead 11 and the second lead 12, a protective layer such as silicon oxide is preferably provided on the surface of the metal layer containing silver. As a result, it is possible to reduce discoloration of the metal layer containing silver due to sulfur components in the atmosphere, or the like. Examples of a film formation method of the protective layer include a known method such as vacuum processing, namely, sputtering or the like.

The resin portion 13 is a member that holds the first lead 11 and the second lead 12. As illustrated in FIG. 4, the resin portion 13 includes the at least one resin recess 14 (indicated by hatching). The resin portion 13 may include a plurality of the resin recesses 14. The resin recess 14 is positioned between the first lead 11 and the second lead 12. The resin recess 14 is recessed lower than an upper surface 111 of the first lead 11. The resin recess 14 is recessed lower than an upper surface 121 of the second lead 12. Because the resin portion 13 includes the resin recess 14, the surface area of the resin portion 13 can be increased. As a result, because the contact area between the covering member 30 and the resin portion 13 can be increased, it is possible to separation of the covering member 30 from the resin package 10.

At least a portion of the resin recess 14 is located between the first portion 11A and the second portion 12A in the first direction (X direction) and located between the first extended portion 11B and the second extended portion 12B in the second direction (Y direction). With this configuration, when an external force is applied from the first direction and/or the second direction, deformation of at least the portion of the resin recess 14 can be reduced. Thus, cracking of the resin portion 13 can be reduced.

It is preferable that the at least one resin recess 14 be entirely located between the first extended portion 11B and the second extended portion 12B in the second direction. With this configuration, cracking of the resin portion 13 can be further reduced. When a plurality of the resin recesses 14 are provided, it is preferable that all of the plurality of resin recesses 14 be entirely located between the first extended portion 11B and the second extended portion 12B in the second direction. With this configuration, cracking of the resin portion 13 can be further reduced.

It is preferable that the at least one resin recess 14 be entirely located between the first portion 11A and the second portion 12A in the first direction. With this configuration, cracking of the resin portion 13 can be further reduced. When a plurality of the resin recesses 14 are provided, it is preferable that all of the plurality of resin recesses 14 be entirely located between the first portion 11A and the second portion 12A in the first direction. With this configuration, cracking of the resin portion 13 can be further reduced.

The size of the resin recess 14 in a plan view is not particularly limited. The maximum length of the resin recess 14 in the first direction (X direction) is preferably longer than the maximum length of the resin recess 14 in the second direction (Y direction). With this configuration, it can be facilitated to increase the surface area of the resin recess 14 compared with a case in which the maximum length of the resin recess 14 in the first direction (X direction) is shorter than the maximum length of the resin recess 14 in the second direction (Y direction). Accordingly, adhesion between the resin portion 13 and the covering member 30 is more easily improved, and thus it is possible to reduce separation of the covering member 30 from the resin package 10. In the present specification, the maximum length of the resin recess 14 in the first direction (X direction) is a length from a portion of the resin recess 14 positioned farthest along the positive X direction to a portion of the resin recess 14 positioned farthest along the negative X direction. When a plurality of the resin recesses 14 are provided, the maximum length of the resin recess 14 in the first direction (X direction) is a length from a portion of the resin recess 14 positioned furthest along the positive X direction among the plurality of resin recesses 14, to a portion of the resin recess 14 positioned furthest along the negative X direction among the plurality of resin recesses 14. Similarly, the maximum length of the resin recess 14 in the second direction (Y direction) is a length from a portion of the resin recess 14 positioned farthest along the positive Y direction to a portion of the resin recess 14 positioned farthest along the negative Y direction. When a plurality of the resin recesses 14 are provided, the maximum length of the resin recess 14 in the second direction (Y direction) is a length from a portion of the resin recess 14 positioned furthest along the positive Y direction among the plurality of resin recesses 14, to a portion of the resin recess 14 positioned furthest along the negative Y direction among the plurality of resin recesses 14.

In a plan view, the resin recess 14 may be in contact with or separated from the first lead 11 and/or the second lead 12. In a plan view, the resin recess 14 is preferably in contact with the first lead 11 and the second lead 12. This makes it easier to increase the surface area of the resin recess 14. The surface of the resin recess 14 preferably includes a protrusion. This makes it easier to increase the surface area of the resin recess 14.

At least a portion of the resin recess 14 is preferably located between the first protrusion 11B1 and the second protrusion 12B1 in the second direction (Y direction). Due to the presence of the first protrusion 11B1, it can be facilitated to increase the volume of the first lead 11. By increasing the volume of the first lead 11, deformation of the first lead 11 due to an external force is reduced. Similarly, due to the presence of the second protrusion 12B1, it can be facilitated to increase the volume of the second lead 12. By increasing the volume of the second lead 12, deformation of the second lead 12 due to an external force is reduced. With at least a portion of the resin recess 14 located between the first lead 11 and the second lead 12, which are unlikely to deform, deformation of the resin recess 14 can be reduced. As a result, cracking of the resin portion 13 can be reduced.

When a plurality of the resin recesses 14 are provided, the plurality of resin recesses 14 are preferably disposed on a straight line extending in the first direction (X direction). This makes it easier to downsize the light emitting device in the second direction (Y direction). In the present specification, the plurality of resin recesses 14 being disposed on the straight line extending in the first direction (X direction) means that an imaginary straight line extending parallel to the first direction (X direction) overlaps the plurality of resin recesses 14. It is preferable that all of the plurality of resin recesses 14 be disposed on the straight line extending in the first direction (X direction).

As a resin material of the resin portion 13, a known material such as a thermosetting resin or a thermoplastic resin can be used. In the case of a thermoplastic resin, for example, a polyphthalamide resin, a polybutylene terephthalate (PBT), an unsaturated polyester, or the like can be used. In the case of a thermosetting resin, for example, an epoxy resin, modified epoxy resin, silicone resin, modified silicone resin, or the like, or a combination thereof can be used. It is particularly preferable to use a thermosetting resin such as epoxy resin or silicone resin, which has good heat resistance and light resistance properties, as the resin material.

The resin material of the resin portion 13 preferably contains a light reflecting material. As the light reflecting material, a member that does not easily absorb light from the light emitting element and has a great refractive index difference with respect to the resin material is preferably used. Examples of such a light reflecting material include, for example, titanium oxide, zinc oxide, silicon oxide, zirconium oxide, aluminum oxide, and aluminum nitride. The light reflecting material can be contained in a range from 10 wt. % to 90 wt. % relative to the resin material, for example.

Light Emitting Element 20

The light emitting element 20 is a semiconductor element that emits light when a voltage is applied thereto. A known semiconductor element constituted by a nitride semiconductor or the like can be used as the light emitting element 20. Examples of the light emitting element 20 include an LED chip. The light emitting element 20 includes a semiconductor layered body and an element electrode. The semiconductor layered body includes an n-type semiconductor layer, a p-type semiconductor layer, and a light emitting layer located between the n-type semiconductor layer and the p-type semiconductor layer. The light emitting layer may have a structure such as a double hetero junction structure or a single quantum well (SQW) structure, or may have a structure having a single active layer group such as a multiple quantum well (MQW) structure. The semiconductor layered body is configured to emit visible light or ultraviolet light. The semiconductor layered body including such a light emitting layer can include $In_xAl_yGa_{1-x-y}N$ ($0 \leq x$, $0 \leq y$, $x+y \leq 1$), for example.

The semiconductor layered body may have a structure including one or more of the light emitting layers disposed between the n-type semiconductor layer and the p-type semiconductor layer, or may have a structure in which a structure of the n-type semiconductor layer, the light emitting layer, and the p-type semiconductor layer disposed in this order is repeated a plurality of times. When the semiconductor layered body includes a plurality of the light emitting layers, these light emitting layers may be layers having mutually different emission peak wavelengths from each other, or light emitting layers having the same emission peak wavelength as each other. Note that the phrase "the light emitting layers have the same emission peak wavelength as each other" includes a variation within ±10 nm among the emission peak wavelengths. A combination of the emission peak wavelengths between the plurality of light emitting layers can be selected as appropriate. For example, when the semiconductor layered body includes two of the light emitting layers, the light emitting layers can be selected in a combination of blue light and blue light, green light and green light, red light and red light, ultraviolet light and ultraviolet light, blue light and green light, blue light and red light, green light and red light, or the like. Each of the light emitting layers may include a plurality of active layers having different emission peak wavelengths from each other, or may include a plurality of active layers having the same emission peak wavelength as each other.

Only one of the light emitting elements 20 may be mounted on one light emitting device, or a plurality of the light emitting elements 20 may be mounted on one light emitting device. As illustrated in FIG. 1, two of the light emitting elements 20 may be mounted on the light emitting device 100. In the present specification, the two light emitting elements 20 may be referred to as a first light emitting element 20A and a second light emitting element 20B. In the first direction (X direction), the first light emitting element 20A and the second light emitting element 20B are preferably disposed side by side. This makes it easier to downsize the light emitting device 100 in the second direction (Y direction).

When a plurality of light emitting elements are to be mounted, a plurality of light emitting elements having the same emission peak wavelength as each other may be combined in order to improve luminous intensity. Alternatively, in order to improve color reproductively, a plurality of light emitting elements having different emission peak wavelengths from each other to correspond to a red color, a green color, and a blue color may be combined. When the light emitting device is provided with a plurality of light emitting elements, all of the plurality of light emitting elements may be connected to each other in series or in parallel, or the plurality of light emitting elements may be connected to each other using a combination of series connection and parallel connection.

Figure 2B:
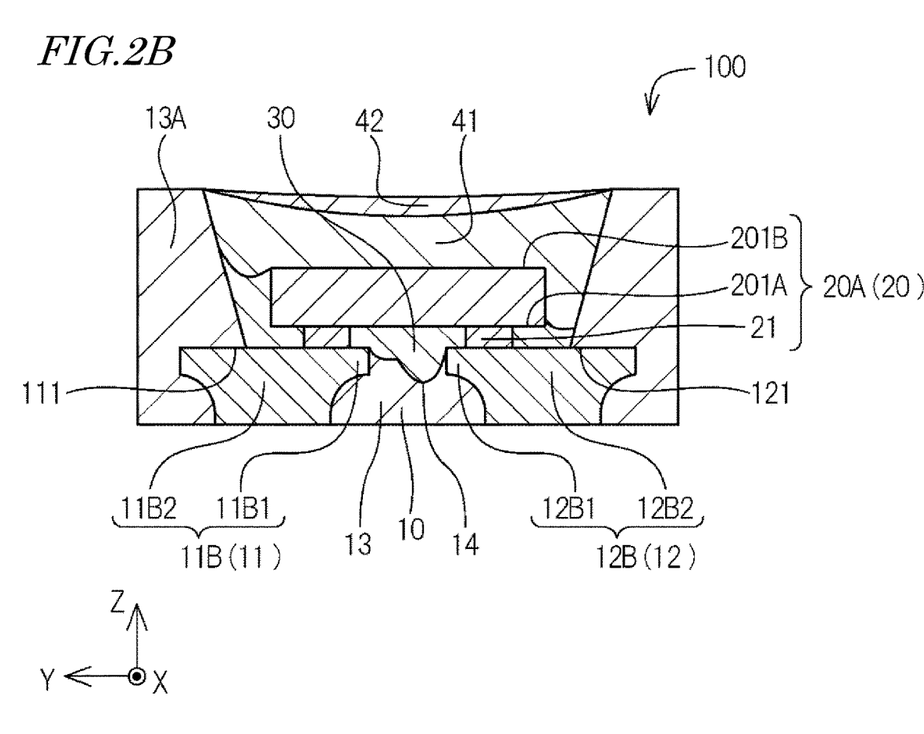
FIG. 2B is an exemplary schematic cross-sectional view taken along line IIB-IIB illustrated in FIG. 1.

The light emitting element 20 has an electrode surface 201A that includes at least one electrode, for example, a pair of positive and negative element electrodes 21. Face-up mounting may be employed in which an electrode surface including a pair of positive and negative element electrodes is mounted so as to face upward, or, as illustrated in FIG. 2B, flip-chip mounting may be employed in which the electrode surface 201A including the pair of positive and negative element electrodes 21 is mounted so as to face the first lead 11. In the present specification, a surface, of the light emitting element 20, that faces a mounting surface, of the resin package 10, on which the light emitting element 20 is mounted may be referred to as a lower surface of a light emitting element. When face-up mounting is employed, a surface located on a side opposite to the electrode surface including the pair of positive and negative element electrodes is the lower surface of the light emitting element, and when flip-chip mounting is employed, the electrode surface including the pair of positive and negative element electrodes is the lower surface of the light emitting element. Further, a surface located on a side opposite to the lower surface of the light emitting element may be referred to as an upper surface of the light emitting element, and a surface located between the upper surface of the light emitting element and the lower surface of the light emitting element may be referred to as a lateral surface of the light emitting element.

Covering Member 30

The covering member 30 is a member that covers at least a portion of the upper surface of each of the first lead 11, the second lead 12, and the resin portion 13. As a result, the upper surfaces of the first lead 11, the second lead 12, and the resin portion 13 can be protected from an external force, or the like. The covering member 30 covers at least a portion of the resin recess 14. The upper surface of the light emitting element may be covered by the covering member 30, or may be exposed from the covering member 30 as illustrated in FIGS. 2A and 2B. When the electrode surface 201A of the light emitting element 20 and the first lead 11 face each other, the covering member 30 preferably covers the electrode surface 201A. In this way, the covering member 30 is located between the electrode surface 201A and the first lead 11. As a result, it is possible to reduce separation of the covering member 30 from the resin package 10.

The covering member 30 can be provided with a function such as wavelength conversion and/or light reflection, depending on particles added to the covering member 30. Specifically, the resin material of the covering member 30 may contain a phosphor and/or a light reflecting material. A resin material similar to that of the resin portion 13 can be used as the resin material of the covering member 30. A dimethyl silicone resin having good light resistance properties is preferably used as the resin material of the covering member 30. When the covering member 30 contains a phosphor, color adjustment of the light emitting device 100 can be facilitated. Examples of the phosphor include an yttrium aluminum garnet-based phosphor ($Y_3(Al,Ga)_5O_{12}$:Ce, for example), a lutetium aluminum garnet-based phosphor ($Lu_3(Al,Ga)_5O_{12}$:Ce, for example), a terbium aluminum garnet-based phosphor ($Tb_3(Al,Ga)_5O_{12}$:Ce, for example), a β-SiAlON-based phosphor (($Si, Al)_3(O,N)_4$:Eu, for example), an α-SiAlON-based phosphor ($(Mz(Si,Al)_{12}(O,N)_{16}$:Eu, for example (where $0<z\leq2$, and M is Li, Mg, Ca, Y, and a lanthanide element excluding La and Ce)), a nitride phosphor such as a CASN-based phosphor ($CaAlSiN_3$:Eu, for example) or an SCASN-based phosphor (($Sr,Ca)AlSiN_3$:Eu, for example), a fluoride phosphor such as a KSF based phosphor ($K_2SiF_6$:Mn, for example), a KSAF based phosphor ($K_2(Si,Al)F_6$:Mn, for example), or an MGF based phosphor ($3.5MgO\cdot0.5MgF_2GeO2$:Mn, for example), a phosphor having a perovskite structure (CsPb$(F,Cl,Br,I)_3$, for example), a quantum dot phosphor (CdSe, InP, $AgInS_2$, or $AgInSe_2$, for example), and the like, and a combination thereof. One type of phosphor or a plurality of types of phosphor may be used as the phosphor contained in the covering member 30.

The KSAF-based phosphor may have a composition expressed by Formula (I) described below.

$$M_2[Si_pAl_qMn_rF_s] \qquad (I)$$

In Formula (I), M represents an alkali metal, and may include at least K. Mn may be a tetravalent Mn ion. p, q, r, and s may satisfy $0.9\leq p+q+r\leq1.1$, $0<q\leq0.1$, $0<r\leq0.2$, and $5.9\leq s\leq6.1$. p, q, r, and s may preferably satisfy $0.95\leq p+q+r\leq1.05$ or $0.97\leq p+q+r\leq1.03$, $0\leq q\leq0.03$, $0.002\leq q\leq0.02$, or $0.003\leq q\leq0.015$, $0.005\leq r\leq0.15$, $0.01\leq r\leq0.12$, or $0.015\leq r\leq0.1$, and $5.92\leq s\leq6.05$ or $5.95\leq s\leq6.025$.

Examples of the Composition Include Compositions Expressed by
$K_2[Si_{0.946}Al_{0.005}Mn_{0.049}F_{5.995}]$,
$K_2[Si_{0.942}Al_{0.008}Mn_{0.050}F_{5.992}]$, and
$K_2[Si_{0.939}Al_{0.014}Mn_{0.047}F_{5.986}]$. With such a KSAF-based phosphor, it is possible to achieve red light emission having a high luminance and a narrow half-value width of the emission peak wavelength.

The covering member 30 may contain the light reflecting material. When the covering member 30 contains the light reflecting material, light emitted from the light emitting element 20 is reflected by the covering member 30, and absorption of this light by the resin package 10 can be reduced. As a result, light extraction efficiency of the light emitting device 100 can be improved. A light reflecting material similar to that of the resin portion 13 can be used as the light reflecting material of the covering member 30.

When the covering member 30 contains the light reflecting material, as illustrated in FIG. 2A, at least a portion of a first element first lateral surface 201C, of the first light emitting element 20A, facing a lateral surface of the second light emitting element 20B is preferably covered by the covering member 30. With this configuration, absorption of light emitted from the first light emitting element 20A by the second light emitting element 20B can be reduced. The first element first lateral surface 201C is a portion of a lateral surface of the first light emitting element 20A. Further, at least a portion of a second element first lateral surface 202C, of the second light emitting element 20B, facing the first element first lateral surface 201C of the first light emitting element 20A is preferably covered by the covering member 30. With this configuration, absorption of light emitted from the second light emitting element 20B by the first light emitting element 20A can be reduced.

As illustrated in FIG. 2A, in a cross-sectional view, a height of the covering member 30 covering a first element second lateral surface 201D located on a side opposite to the first element first lateral surface 201C is preferably lower than a height of the covering member 30 covering the first element first lateral surface 201C. With this configuration, shielding of the light emitted from the first light emitting element 20A by the covering member 30 can be reduced, and thus the light extraction efficiency of the light emitting device 100 is improved. Similarly, in a cross-sectional view, a height of the covering member 30 covering the second element second lateral surface 202D located on the side opposite to the second element first lateral surface 202C is preferably lower than a height of the covering member 30 covering the second element first lateral surface 202C.

First Light-Transmissive Member 41

The light emitting device 100 may include the first light-transmissive member 41 that covers the light emitting element 20. The first light-transmissive member 41 has light transmissivity. Note that, in the present specification, having light transmissivity means that a transmittance of light emitted at the peak wavelength from the light emitting element is 40% or more. When the light emitting device includes a plurality of the light emitting elements, it is sufficient that the transmittance of light emitted at the peak wavelength from at least one of the plurality of light emitting elements be 40% or more. As illustrated in FIGS. 2A and 2B, the first light-transmissive member 41 covers the upper surface of the light emitting element 20. As a result, the light emitting element 20 can be protected from an external force, or the like. The first light-transmissive member 41 is in contact with the covering member 30. A surface at which the first light-transmissive member 41 and the covering member 30 are in contact with each other preferably has one or more protrusions and one or more recesses. With this configuration, adhesion between the first light-transmissive member 41 and the covering member 30 is improved. Examples of a method of forming the protrusions and recesses on the surface of the covering member 30 include grinding, blasting, and the like, and a combination thereof. A resin material of the first light-transmissive member 41 may contain a phosphor and/or a light reflecting material. A resin material similar to that of the resin portion 13 can be used as the resin material of the first light-transmissive member 41. It is particularly preferable that the first light-transmissive member 41 contain a dimethyl silicone resin having good light resistance properties. A phosphor similar to that of the covering member 30 can be used as the phosphor used in the first light-transmissive member 41. A light reflecting material similar to that of the resin portion 13 can be used as the light reflecting material used in the first light-transmissive member 41. Because the first light-transmissive member 41 contains the light reflecting material, it can be facilitated to diffuse the light emitted from the light emitting element 20.

Second Light-Transmissive Member 42

The light emitting device 100 may include the second light-transmissive member 42 that is in contact with the first light-transmissive member 41 and covers the light emitting element 20. The second light-transmissive member 42 has light transmissivity. As illustrated in FIGS. 2A and 2B, the second light-transmissive member 42 covers the upper surface of the light emitting element 20 via the first light-transmissive member 41. As a result, the light emitting element 20 can be protected from an external force, or the like. A surface at which the first light-transmissive member 41 and the second light-transmissive member 42 are in contact with each other preferably has protrusions and recesses. With this configuration, adhesion between the first light-transmissive member 41 and the second light-transmissive member 42 is improved. Examples of a method of forming the protrusions and recesses on the surface of the first light-transmissive member 41 include grinding, blasting, and the like. A resin material of the second light-transmissive member 42 may contain a phosphor and/or a light reflecting material. A resin material similar to that of the resin portion 13 can be used as the resin material of the second light-transmissive member 42. The second light-transmissive member 42 preferably includes a phenyl silicone resin that is less likely to allow moisture to pass through than the dimethyl silicone resin. Thus, deterioration of the light emitting element or the like due to moisture can be reduced. When the first light-transmissive member 41 contains the phosphor, it is preferable that the second light-transmissive member 42 does not contain the phosphor. With this configuration, the second light-transmissive member 42, which does not contain a phosphor, also functions as a protective layer, and thus deterioration of the phosphor of the first light-transmissive member 41 due to moisture or the like can be reduced. Examples of a phosphor that is easily affected by moisture include KSF-based phosphors, and KSAF-based phosphors. In the present specification, "does not contain a phosphor" means that an unavoidably mixed phosphor is not excluded, and includes a case in which the content ratio of wavelength conversion particles is 0.05 wt. % or less.

Protective Element 50

The light emitting device 100 may include the protective element 50 mounted on the resin package 10. The protective element 50 is an element for protecting the light emitting element 20 from static electricity or a high voltage surge. A specific example of the protective element 50 is a Zener diode. The protective element 50 and the light emitting element 20 are electrically connected in parallel. In order to reduce light emitted from the light emitting element 20 from being absorbed by the protective element 50, the protective element 50 is preferably covered by a covering member.

An exemplary embodiment of the present invention has been described above with reference to specific examples. However, the present invention is not limited to these specific examples. All aspects that can be practiced by a person skilled in the art modifying the design as appropriate based on the above-described embodiment of the present invention are also included in the scope of the present invention, as long as they encompass the spirit of the present invention. In addition, in the spirit of the present invention, a person skilled in the art can conceive of various modified examples and modifications, and those modified examples and modifications will also fall within the scope of the present invention.

A light emitting device according to an embodiment of the present invention can be used in various light emitting devices such as a light source for a backlight of a liquid crystal panel, a light source for illumination, a light source for an in-vehicle device, and a light source for a display.

What is claimed is:
1. A light emitting device comprising:
a resin package including a first lead, a second lead, and a resin portion holding the first lead and the second lead;
at least one light emitting element mounted on the resin package; and
a covering member covering at least a portion of an upper surface of the first lead, at least a portion of an upper surface of the second lead, and at least a portion of an upper surface of the resin portion, wherein
the first lead includes a first portion and a first extended portion extending in a first direction from the first portion toward the second lead,
the second lead includes a second portion overlapping the first portion in the first direction, and a second extended portion extending in the first direction from the second portion toward the first lead and overlapping the first extended portion in a second direction orthogonal to the first direction,
the resin portion includes, between the first lead and the second lead, at least one resin recess recessed lower than the upper surface of the first lead,
at least a portion of the resin recess is located between the first portion and the second portion in the first direction, and is located between the first extended portion and the second extended portion in the second direction,
at least a portion of the resin recess is covered by the covering member, and
a maximum length of the resin recess in the first direction is longer than a maximum length of the resin recess in the second direction.

2. The light emitting device according to claim 1, wherein the resin recess is entirely located between the first extended portion and the second extended portion in the second direction.

3. The light emitting device according to claim 1, wherein the first extended portion includes a first protrusion extending in the second direction,
the second extended portion includes a second protrusion facing the first protrusion, and
at least a portion of the resin recess is located between the first protrusion and the second protrusion.

4. The light emitting device according to claim 1, wherein the resin portion includes a plurality of the resin recesses.

5. The light emitting device according to claim 4, wherein the plurality of resin recesses are disposed on a straight line extending in the first direction.

6. The light emitting device according to claim 1, wherein the at least one light emitting element has an electrode surface including at least one electrode,
the electrode surface faces the first lead, and
the covering member covers the electrode surface.

7. The light emitting device according to claim 1, wherein the covering member contains a light reflecting material.

8. The light emitting device according to claim 7, wherein the at least one light emitting element includes a first light emitting element and a second light emitting element, and
at least a portion of a first element first lateral surface, of the first light emitting element, facing a lateral surface of the second light emitting element is covered by the covering member.

9. The light emitting device according to claim 8, wherein in a cross-sectional view, a height of the covering member covering a first element second lateral surface located on a side opposite to the first element first lateral surface is lower than a height of the covering member covering the first element first lateral surface.

10. The light emitting device according to claim 1, further comprising:
a first light-transmissive member in contact with the covering member and covering the light emitting element.

11. The light emitting device according to claim 10, wherein
the first light-transmissive member contains a dimethyl silicone resin.

12. The light emitting device according to claim 10, further comprising:
a second light-transmissive member in contact with the first light-transmissive member and covering the light emitting element.

13. The light emitting device according to claim 12, wherein
the second light-transmissive member contains a phenyl silicone resin.

14. The light emitting device according to claim 12, wherein
the first light-transmissive member contains a phosphor, and
the second light-transmissive member does not contain a phosphor.

15. The light emitting device according to claim 1, wherein
the resin recess is entirely located between the first extended portion and the second extended portion in the second direction,
the first extended portion includes a first protrusion extending in the second direction,
the second extended portion includes a second protrusion facing the first protrusion, and
at least a portion of the resin recess is located between the first protrusion and the second protrusion.

16. The light emitting device according to claim 1, wherein
the resin recess is entirely located between the first extended portion and the second extended portion in the second direction,
the first extended portion includes a first protrusion extending in the second direction,
the second extended portion includes a second protrusion facing the first protrusion,
at least a portion of the resin recess is located between the first protrusion and the second protrusion, and
the resin portion includes a plurality of the resin recesses.

17. The light emitting device according to claim 1, wherein
the resin recess is entirely located between the first extended portion and the second extended portion in the second direction,
the first extended portion includes a first protrusion extending in the second direction,
the second extended portion includes a second protrusion facing the first protrusion,
at least a portion of the resin recess is located between the first protrusion and the second protrusion,
the resin portion includes a plurality of the resin recesses, and
the plurality of resin recesses are disposed on a straight line extending in the first direction.

18. The light emitting device according to claim 1, wherein
the resin recess is entirely located between the first extended portion and the second extended portion in the second direction,
the first extended portion includes a first protrusion extending in the second direction,
the second extended portion includes a second protrusion facing the first protrusion, at least a portion of the resin recess is located between the first protrusion and the second protrusion,
the resin portion includes a plurality of the resin recesses,
the plurality of resin recesses are disposed on a straight line extending in the first direction, and
the at least one light emitting element has an electrode surface including at least one electrode,
the electrode surface faces the first lead, and
the covering member covers the electrode surface.

19. A light emitting device comprising:
a resin package including a first lead, a second lead, and a resin portion holding the first lead and the second lead;
at least one light emitting element mounted on the resin package; and
a covering member covering at least a portion of an upper surface of the first lead, at least a portion of an upper surface of the second lead, and at least a portion of an upper surface of the resin portion, wherein
the first lead includes a first portion and a first extended portion extending in a first direction from the first portion toward the second lead,
the second lead includes a second portion overlapping the first portion in the first direction, and a second extended portion extending in the first direction from the second portion toward the first lead and overlapping the first extended portion in a second direction orthogonal to the first direction,
the resin portion includes, between the first lead and the second lead, at least one resin recess recessed lower than the upper surface of the first lead,
at least a portion of the resin recess is located between the first portion and the second portion in the first direction, and is located between the first extended portion and the second extended portion in the second direction,
at least a portion of the resin recess is covered by the covering member,
the covering member contains a light reflecting material,
the at least one light emitting element includes a first light emitting element and a second light emitting element, and
at least a portion of a first element first lateral surface, of the first light emitting element, facing a lateral surface of the second light emitting element is covered by the covering member.

20. The light emitting device according to claim 19, wherein
in a cross-sectional view, a height of the covering member covering a first element second lateral surface located on a side opposite to the first element first lateral surface is lower than a height of the covering member covering the first element first lateral surface.

* * * * *